(12) United States Patent
Nguyen et al.

(10) Patent No.: US 7,183,201 B2
(45) Date of Patent: Feb. 27, 2007

(54) SELECTIVE ETCHING OF ORGANOSILICATE FILMS OVER SILICON OXIDE STOP ETCH LAYERS

(75) Inventors: Huong Thanh Nguyen, San Ramon, CA (US); Michael Scott Barnes, San Ramon, CA (US); Li-Qun Xia, San Jose, CA (US); Mehul Naik, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 537 days.

(21) Appl. No.: 09/912,103

(22) Filed: Jul. 23, 2001

(65) Prior Publication Data

US 2003/0017694 A1    Jan. 23, 2003

(51) Int. Cl.
*H01L 21/4763* (2006.01)
(52) U.S. Cl. .................. 438/637; 438/700; 438/709
(58) Field of Classification Search ........... 438/584, 438/634, 695, 689, 636, 637, 638, 672, 700, 438/706, 709, 712, 789, 790
See application file for complete search history.

(56) References Cited

U.S. PATENT DOCUMENTS

| | | | |
|---|---|---|---|
| 4,310,380 A | 1/1982 | Flamm et al. | 156/643 |
| 4,401,745 A * | 8/1983 | Nakane et al. | 430/197 |
| 4,484,978 A | 11/1984 | Keyser | 156/643 |
| 4,504,574 A | 3/1985 | Meyer et al. | 430/331 |
| 4,666,555 A | 5/1987 | Tsang | 156/643 |
| 4,713,141 A | 12/1987 | Tsang | 156/643 |
| 4,726,879 A | 2/1988 | Bondur et al. | 156/643 |
| 4,741,799 A | 5/1988 | Chen et al. | 156/643 |
| 5,110,408 A | 5/1992 | Fujii et al. | 156/643 |
| 5,164,330 A | 11/1992 | Davis et al. | 437/192 |
| 5,242,538 A | 9/1993 | Hamrah et al. | 156/643 |
| 5,316,616 A | 5/1994 | Nakamura et al. | 156/643 |
| 5,358,601 A | 10/1994 | Cathey | 156/656 |
| 5,429,070 A | 7/1995 | Campbell et al. | 118/723 R |
| 5,433,823 A | 7/1995 | Cain | 156/662.1 |
| 5,458,734 A | 10/1995 | Tsukamoto | 156/643.1 |
| 5,486,706 A | 1/1996 | Yuki et al. | 257/25 |
| 5,571,366 A | 11/1996 | Ishii et al. | 156/345 |
| 5,635,102 A | 6/1997 | Mehta | 428/428 |
| 5,643,473 A | 7/1997 | Tachi et al. | 216/67 |

(Continued)

FOREIGN PATENT DOCUMENTS

DE        27 01 458 A1    7/1977

(Continued)

OTHER PUBLICATIONS

Search Report for PCT/US01/19282, dated May 31, 2002.

(Continued)

*Primary Examiner*—Matthew Smith
*Assistant Examiner*—Khiem Nguyen
(74) *Attorney, Agent, or Firm*—Patterson and Sheridan

(57) ABSTRACT

A method of selectively etching organosilicate layers in integrated circuit fabrication processes is disclosed. The organosilicate layers are selectively etched using a hydrogen-containing fluorocarbon gas. The hydrogen-containing fluorocarbon gas may be used to selectively etch an organosilicate layer formed on a silicon oxide stop etch layer when fabricating a damascene structure.

24 Claims, 6 Drawing Sheets

U.S. PATENT DOCUMENTS

| | | | |
|---|---|---|---|
| 5,658,472 A | 8/1997 | Bartha et al. | 216/2 |
| 5,705,025 A | 1/1998 | Dietrich et al. | 156/643.1 |
| 5,759,921 A | 6/1998 | Rostoker | 438/711 |
| 5,767,021 A | 6/1998 | Imai et al. | 438/719 |
| 5,773,199 A | 6/1998 | Linliu et al. | 430/316 |
| 5,843,847 A | 12/1998 | Pu et al. | 438/723 |
| 5,854,136 A | 12/1998 | Huang et al. | 438/714 |
| 5,880,033 A | 3/1999 | Tsai | 438/710 |
| 5,899,749 A | 5/1999 | Becker et al. | 438/714 |
| 5,900,163 A | 5/1999 | Yi et al. | 216/79 |
| 5,933,729 A | 8/1999 | Chan | 438/257 |
| 5,965,463 A | 10/1999 | Cui et al. | 438/723 |
| 5,994,160 A | 11/1999 | Niedermann et al. | 438/53 |
| 5,994,235 A | 11/1999 | O'Donnel | 438/720 |
| 6,007,732 A | 12/1999 | Hashimoto et al. | 216/47 |
| 6,025,271 A | 2/2000 | Howard et al. | 438/697 |
| 6,033,979 A | 3/2000 | Endo | 438/622 |
| 6,037,265 A | 3/2000 | Mui et al. | 438/719 |
| 6,054,379 A | 4/2000 | Yau et al. | |
| 6,080,529 A | 6/2000 | Ye et al. | 430/318 |
| 6,083,822 A * | 7/2000 | Lee | 438/624 |
| 6,114,250 A | 9/2000 | Ellingboe et al. | 438/709 |
| 6,123,088 A * | 9/2000 | Ho | 134/1.3 |
| 6,140,226 A | 10/2000 | Grill et al. | |
| 6,147,009 A | 11/2000 | Grill et al. | 438/780 |
| 6,147,226 A | 11/2000 | Lapin et al. | 549/70 |
| 6,159,871 A | 12/2000 | Loboda et al. | 438/786 |
| 6,184,128 B1 * | 2/2001 | Wang et al. | 438/637 |
| 6,214,637 B1 | 4/2001 | Kim et al. | 438/72 |
| 6,217,784 B1 | 4/2001 | Thakur et al. | 216/57 |
| 6,221,784 B1 | 4/2001 | Schmidt et al. | 438/719 |
| 6,235,653 B1 * | 5/2001 | Chien et al. | 438/788 |
| 6,251,217 B1 | 6/2001 | Ye et al. | 156/345 |
| 6,277,763 B1 | 8/2001 | Kugimiyama et al. | 438/710 |
| 6,312,616 B1 | 11/2001 | Chinn et al. | 216/68 |
| 6,323,121 B1 * | 11/2001 | Liu et al. | 438/633 |
| 6,331,380 B1 * | 12/2001 | Ye et al. | 430/318 |
| 6,391,790 B1 | 5/2002 | Stoehr et al. | 438/715 |
| 6,410,437 B1 * | 6/2002 | Flanner et al. | 438/689 |
| 6,417,106 B1 * | 7/2002 | Twu et al. | 438/687 |
| 6,432,814 B1 | 8/2002 | Steiner et al. | 438/624 |
| 6,461,533 B1 * | 10/2002 | Horiike et al. | 252/79.1 |
| 6,511,920 B2 * | 1/2003 | Nguyen et al. | 438/763 |
| 6,518,174 B2 * | 2/2003 | Annapragada et al. | 438/637 |
| 6,534,397 B1 | 3/2003 | Okada et al. | 438/633 |
| 6,551,924 B1 * | 4/2003 | Dalton et al. | 438/637 |
| 6,599,839 B1 * | 7/2003 | Gabriel et al. | 438/705 |
| 6,620,733 B2 * | 9/2003 | Ho | 438/700 |
| 6,632,735 B2 * | 10/2003 | Yau et al. | 438/623 |
| 6,777,171 B2 * | 8/2004 | Xu et al. | 430/322 |
| 6,828,250 B1 * | 12/2004 | Annapragada et al. | 438/723 |
| 6,893,969 B2 * | 5/2005 | Ho et al. | 438/706 |
| 7,060,323 B2 * | 6/2006 | Sugahara et al. | 427/249.15 |
| 2001/0005636 A1 * | 6/2001 | Nishizawa | 438/710 |
| 2001/0036721 A1 * | 11/2001 | Dallner et al. | 438/618 |
| 2002/0031906 A1 * | 3/2002 | Jiang et al. | 438/622 |
| 2002/0105084 A1 * | 8/2002 | Li | 257/759 |
| 2002/0119664 A1 * | 8/2002 | Annapragada et al. | 438/700 |
| 2002/0142104 A1 * | 10/2002 | Nemani et al. | 427/489 |
| 2002/0173172 A1 | 11/2002 | Loboda et al. | 438/786 |
| 2002/0177321 A1 | 11/2002 | Li | 438/710 |
| 2002/0177322 A1 | 11/2002 | Li et al. | 438/710 |
| 2003/0008511 A1 | 1/2003 | Tsai et al. | 438/694 |
| 2004/0092113 A1 * | 5/2004 | Ali et al. | 438/690 |

FOREIGN PATENT DOCUMENTS

| | | |
|---|---|---|
| EP | 0 489 407 A2 | 6/1992 |
| EP | 0 552 491 A1 | 7/1993 |
| JP | 60-016422 | 1/1985 |
| JP | 60-219748 | 11/1985 |
| JP | 62-181433 | 8/1987 |
| JP | 09-082686 | 3/1997 |
| WO | 01/96955 | 12/2001 |

OTHER PUBLICATIONS

Pan, et al., "Selective reactive ion etching of tungsten films in CHF$_3$ and other fluorinated gases", *J. Vac. Sci. and Tech. B*, 6(4), (Jul./Aug. 1988), pp. 1073-1080.

Theisen, et al., "Maskless Tungsten Etch Process for Plug Fill", *1046b Extended Abstracts*, Electrochem Soc., Spring Meeting, 90(1) (May 6-11, 1990), pp. 248-249.

Ootera, et al., "Highly Selective Etching of W/WN/Poly-Si Gate on Thin Oxide Film With Gaspuff Plasmas", Proc. of Symp.on Dry Process (Nov. 11-12, 1999), pp. 155-160.

Hayashi, et al., SiO$_2$ Etching Using Inductively Coupled Plasma, *Electronics & Communications in Japan*, Part 2, 81(9) (1998), pp. 21-28.

Kaplita, et al., "Polysilicon planarization and plug recess etching in decoupled plasma source chamber using two endpoint techniques", The SPIE Conf. on Process, Equipment & Materials Control, vol. 3882 (Sep. 1999), pp. 90-97.

Khan, et al. "Plasma Etching of Silicon using Fluorinated Gas Mixtures," Filed Mar. 5, 1999 U.S. Appl. No. 09/263,634.

* cited by examiner

SELECTIVE ETCHING OF ORGANOSILICATE FILMS OVER SILICON OXIDE STOP ETCH LAYERS

BACKGROUND OF THE DISCLOSURE

1. Field of the Invention

The present invention relates to integrated circuits including interconnection structures and, more particularly, to a damascene structure defining conductive paths and/or vias between metal layers and a method of fabricating same.

2. Description of the Background Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e.g., sub-micron dimensions), the materials used to fabricate such components contribute to their electrical performance. For example, low resistivity metal interconnects (e.g., copper (Cu) and aluminum (Al)) provide conductive paths between the components on integrated circuits. Typically, the metal interconnects are electrically isolated from each other by an insulating material. When the distance between adjacent metal interconnects and/or the thickness of the insulating material has sub-micron dimensions, capacitive coupling potentially occurs between such interconnects. Capacitive coupling between adjacent metal interconnects may cause cross-talk and/or resistance-capacitance (RC) delay which degrades the overall performance of the integrated circuit.

In order to minimize capacitive coupling between adjacent metal interconnects, low dielectric constant bulk insulating materials (e.g., dielectric constants less than about 3.0) are needed. Examples of low dielectric constant bulk insulating materials include organosilicates, carbon-doped silicon oxides and carbon-doped fluorosilicate glass (FSG), among others.

In addition, a barrier layer often separates the metal interconnects from the bulk insulating materials. The barrier layer minimizes the diffusion of the metal from the interconnects into the bulk insulating material. Diffusion of the metal from the interconnects into the bulk insulating material is undesirable because such diffusion can affect the electrical performance of the integrated circuit (e.g., crosstalk and/or RC delay), or render it inoperative. Silicon carbide is often used as a barrier material in conjunction with low dielectric constant bulk insulating materials.

Some integrated circuit components may also include damascene structures. Damascene structures are multilevel interconnect structures that typically include two or more bulk insulating material layers and barrier layers stacked one on top of another. The multiple layers of bulk insulating material and barrier material are patterned to define vias and trenches through selected portions thereof. However, when organic or carbon-containing material layers are used for both the bulk insulating material and the barrier material, the etch selectivity of one to the other is poor using conventional fluorine-based etch chemistries. Poor etch selectivity between the bulk insulating material and the barrier material may undesirably form vias and trenches with larger than desired dimensions.

Therefore, a need exists for etch chemistries having good etch selectivity with respect to both bulk insulating materials and barrier materials for use in damascene structures.

SUMMARY OF THE INVENTION

A method of selectively etching organosilicate layers in integrated circuit fabrication processes is provided. The organosilicate layers are selectively etched using one or more hydrogen-containing fluorocarbon gases. The hydrogen-containing fluorocarbon gas may be used to selectively etch an organosilicate layer formed on a silicon oxide layer.

The hydrogen-containing fluorocarbon etch process is compatible with integrated circuit fabrication sequences. In one integrated circuit fabrication sequence, the hydrogen-containing fluorocarbon etch process is used to selectively etch an organosilicate layer formed on a silicon oxide layer when fabricating a damascene structure. For such an embodiment, a preferred process sequence includes depositing a barrier layer on a metal layer formed on a substrate. After the barrier layer is deposited on the substrate a first organosilicate layer is formed thereon. A silicon oxide layer is formed on the first organosilicate layer. Thereafter, a second organosilicate layer is formed on the silicon oxide layer. The second organosilicate layer is patterned and etched down to the silicon oxide layer to define vias therein. The second organosilicate layer is etched using one or more hydrogen-containing fluorocarbon etch gases. After the vias are formed in the second organosilicate layer, the via pattern is transferred through the silicon oxide layer. Thereafter, the second organosilicate layer is patterned to define interconnects therein. The interconnects are positioned over the vias defined through the silicon oxide layer, so that the vias are transferred through the first organosilicate layer when the interconnects are formed in the second organosilicate layer. Thereafter, the damascene structure is completed by filling the vias and interconnects with a conductive material.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
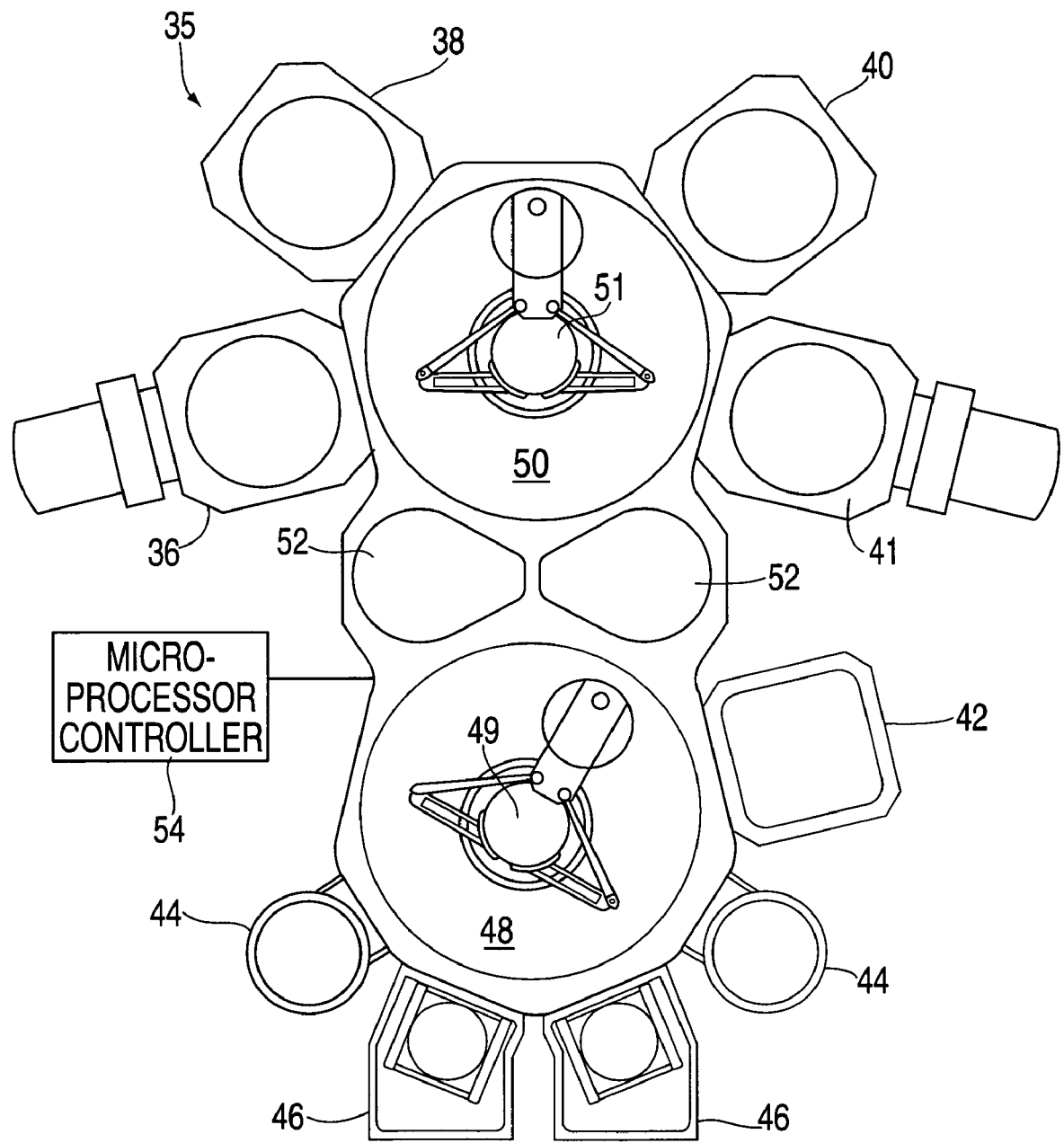
FIG. 1 depicts a schematic illustration of an apparatus that can be used for the practice of embodiments described herein.

FIG. 1 is a schematic representation of a wafer processing system 35 that can be used to perform integrated circuit fabrication in accordance with embodiments described herein. The wafer processing system 35 typically comprises process chambers 36, 38, 40, 41, degas chambers 44, load-lock chambers 46, transfer chambers 48, 50, pass-through chambers 52, a microprocessor controller 54, along with other hardware components such as power supplies (not shown) and vacuum pumps (not shown). An example of such a wafer processing system 35 is an ENDURA® System, commercially available from Applied Materials, Inc., Santa Clara, Calif.

Details of the wafer processing system 35 are described in commonly assigned U.S. Pat. No. 5,186,718, entitled "Staged-Vacuum Substrate Processing System and Method", issued Feb. 16, 1993, and is hereby incorporated by reference. The salient features of the wafer processing system 35 are briefly described below.

The wafer processing system 35 includes two transfer chambers 48, 50, each containing a transfer robot 49, 51. The transfer chambers 48, 50 are separated one from the other by pass-through chambers 52.

Transfer chamber 48 is coupled to load-lock chambers 46, degas chambers 44, pre-clean chamber 42, and pass-through chambers 52. Substrates (not shown) are loaded into the wafer processing system 35 through load-lock chambers 46. Thereafter, the substrates are sequentially degassed and cleaned in degas chambers 44 and the pre-clean chamber 42, respectively. The transfer robot 48 moves the substrates between the degas chambers 44 and the pre-clean chamber 42.

Transfer chamber 50 is coupled to a cluster of process chambers 36, 38, 40, 41. The cleaned substrates are moved from transfer chamber 48 into transfer chamber 50 via pass-through chambers 52. Thereafter, transfer robot 51 moves the substrates between one or more of the process chambers 36, 38, 40, 41.

The process chambers 36, 38, 40, 41 are used to perform various integrated circuit fabrication sequences. For example, process chambers 36, 38, 40, 41 may include chemical vapor deposition (CVD) chambers, physical vapor deposition (PVD) chambers, ionized metal plasma physical vapor deposition (IMP PVD) chambers, rapid thermal process (RTP) chambers, and plasma etch (PE) chambers, among others.

Figure 2:
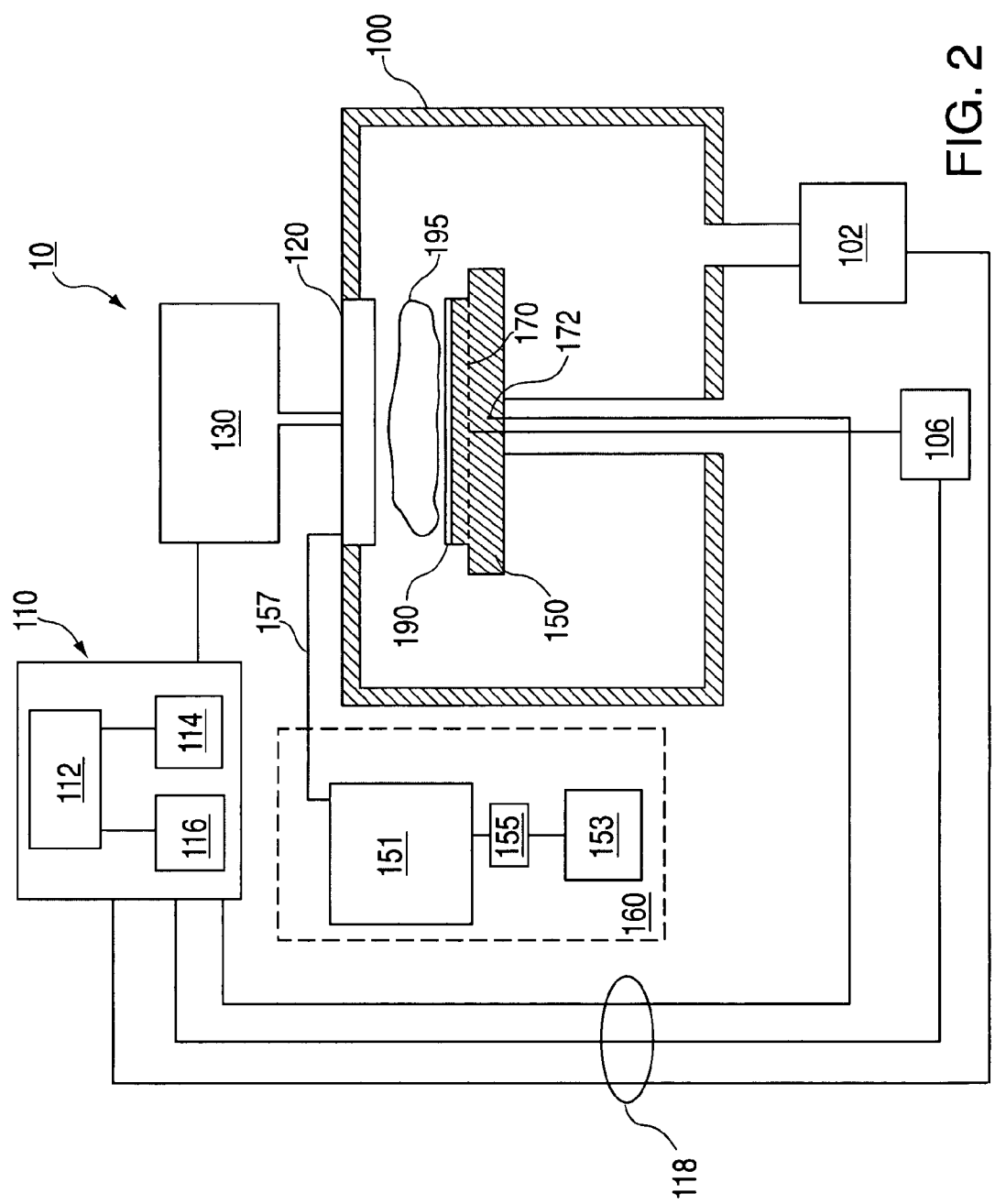
FIG. 2 depicts a schematic cross-sectional view of a chemical vapor deposition (CVD) chamber.

FIG. 2 depicts a schematic cross-sectional view of a chemical vapor deposition (CVD) process chamber 36 of wafer processing system 35. CVD process chamber 36 may be used to deposit organic and/or carbon-containing material layers on semiconductor wafers. Examples of such CVD process chambers 36 include DxZ™ chambers and PRECISION 5000® chambers, commercially available from Applied Materials, Inc., Santa Clara, Calif.

The CVD process chamber 36 generally houses a wafer support pedestal 150, which is used to support a substrate 190. The wafer support pedestal 150 can typically be moved in a vertical direction inside the CVD process chamber 36 using a displacement mechanism (not shown).

Depending on the specific CVD process, the substrate 190 can be heated to some desired temperature prior to or during deposition. For example, the wafer support pedestal 150 may be heated by an embedded heater element 170. The wafer support pedestal 150 may be resistively heated by applying an electric current from an AC power supply 106 to the heater element 170. The substrate 190 is, in turn, heated by the pedestal 150.

A temperature sensor 172, such as a thermocouple, is also embedded in the wafer support pedestal 150 to monitor the temperature of the pedestal 150 in a conventional manner. The measured temperature is used to in a feedback loop to control the AC power supply 106 for the heating element 170, such that the substrate temperature can be maintained or controlled at a desired temperature which is suitable for the particular process application. The wafer support pedestal 150 is optionally heated using radiant heat (not shown).

A vacuum pump 102 is used to evacuate the CVD process chamber 36 and to maintain the proper gas flows and pressure inside such chamber 36. A showerhead 120, through which process gases are introduced into the chamber 36, is located above the wafer support pedestal 150. The showerhead 120 is connected to a gas panel 130, that controls and supplies various gases provided to the chamber 36.

Proper control and regulation of the gas flows through the gas panel 130 is performed by mass flow controllers (not shown) and a microprocessor controller 54 (FIG. 1). The showerhead 120 allows process gases from the gas panel 130 to be uniformly introduced and distributed in the CVD process chamber 36.

The CVD process chamber 36 may comprise additional components for enhancing layer deposition on the substrate 190. For example, the showerhead 120 and wafer support pedestal 150 may also form a pair of spaced apart electrodes. When an electric field is generated between these electrodes, the process gases introduced into the chamber 36 are ignited into a plasma.

Typically, the electric field is generated by coupling the wafer support pedestal 150 to a source of radio frequency (RF) power (not shown) through a matching network (not shown). Alternatively, the RF power source and matching network may be coupled to the showerhead 120, or coupled to both the showerhead 120 and the wafer support pedestal 150.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Optionally, a remote plasma source 160 may be coupled to the CVD process chamber 36 to provide a remotely generated plasma to the process chamber 36. The remote plasma source 160 includes a gas supply 153, a gas flow controller 155, a plasma chamber 151, and a chamber inlet 157. The gas flow controller 155 controls the flow of process gas from the gas supply 153 to the plasma chamber 151.

A remote plasma may be generated by applying an electric field to the process gas in the plasma chamber 151, creating a plasma of reactive species. Typically, the electric field is generated in the plasma chamber 151 using an RF power source (not shown). The reactive species generated in the remote plasma source 150 are introduced into the process chamber 36 through inlet 157.

Figure 3:
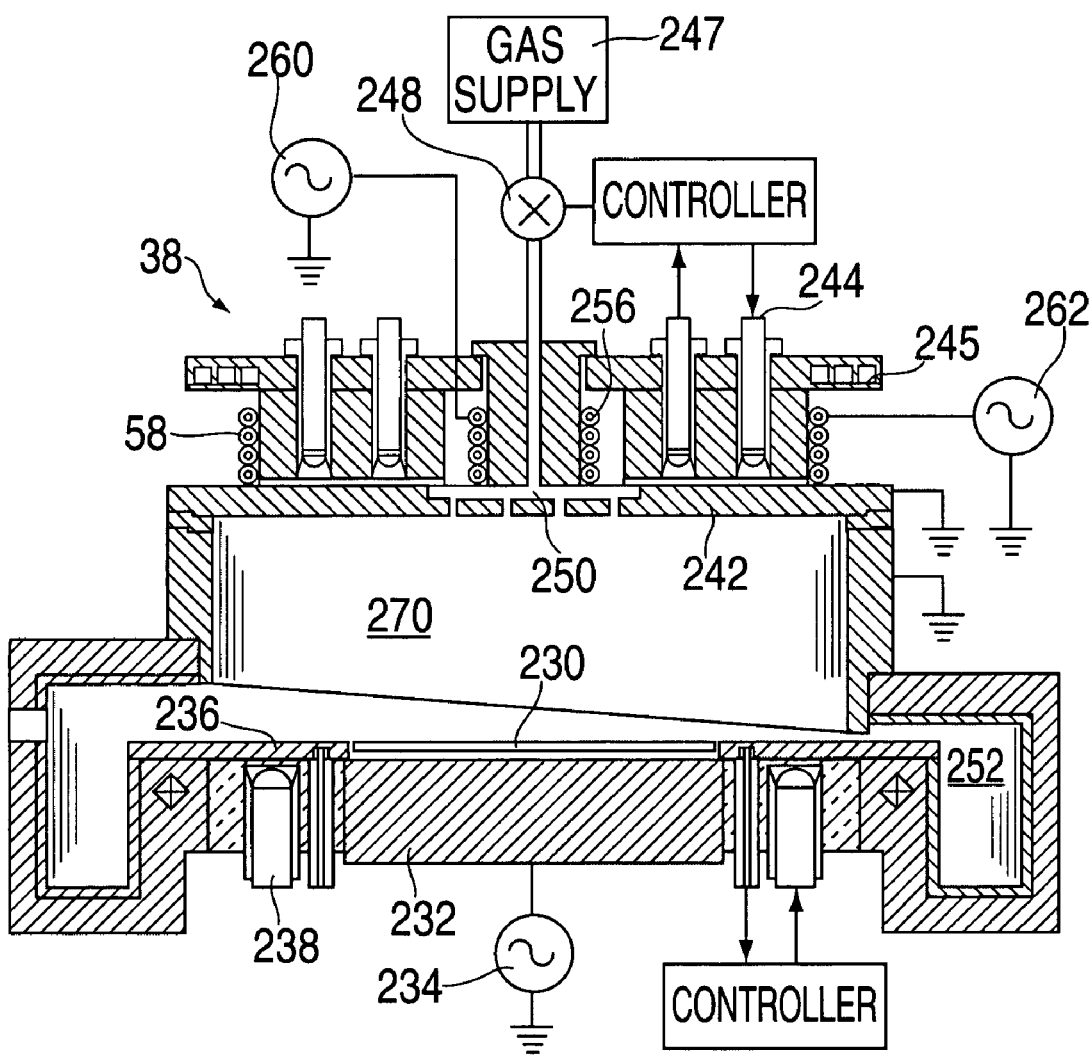
FIG. 3 depicts a schematic cross-sectional view of a plasma etch chamber.

FIG. 3 depicts a schematic cross-sectional view of a plasma etch process chamber 38 of wafer processing system 35. Plasma etch process chamber 38 may be used to etch organic and/or carbon-containing material layers formed on semiconductor wafers. Examples of such plasma etch process chambers 38 include SUPER-E™ chambers, E-MAX™ chambers and EYED™ chambers, commercially available from Applied Materials, Inc., located in Santa Clara, Calif.

Details of the plasma etch process chamber 38 are described in commonly assigned U.S. Pat. No. 6,063,233, entitled "Thermal Control Apparatus for Inductively Coupled RF Plasma Reactor having an Overhead Solenoid Antenna", issued on May 16, 2000, and is hereby incorporated by reference. The salient features of the plasma etch process chamber 38 are briefly described below.

The plasma etch process chamber 38 generally houses a cathode pedestal 232, which is used to support a substrate such as a semiconductor wafer 230. A bias power supplied from a bias power supply 234 to the cathode pedestal 232 capacitatively couples the semiconductor wafer 230 thereto. Application of the bias power to the cathode pedestal 232 also enhances the transport of plasma species (e.g., ions) created in the plasma etch process chamber 38 toward the surface of the semiconductor wafer 230.

Depending on the specific process, the semiconductor wafer 230 can be heated to some desired temperature prior to an etch process. For example, the cathode pedestal 232 may be heated using a silicon ring 236. The silicon ring 236 surrounds the cathode pedestal 232 and is controllably heated by an array of heater lamps 238. The semiconductor wafer 230 is, in turn, heated by the cathode pedestal 232.

A vacuum pump 252, is used to evacuate the plasma etch process chamber 38 and to maintain the proper gas flows and pressure inside the chamber 38. A showerhead 250, through which process gases are introduced into plasma etch process chamber 38, is located above cathode pedestal 232. The showerhead 250 is coupled to a gas supply 247, which controls and supplies various gases used in different steps of a etch process sequence.

Proper control and regulation of the gas flows from the gas supply 247 is performed by mass flow controllers 248 and the microprocessor controller (FIG. 1). The showerhead 250 allows process gases from the gas supply 247 to be uniformly introduced and distributed in the plasma etch process chamber 38.

A silicon roof 242 overlays a plasma processing region 270 of the plasma etch process chamber 38. Heating lamps 244 and water cooling channels 256 control the temperature of the silicon roof 242.

An inner inductive coil stack 256 and an outer inductive coil stack 258 are mounted above the silicon roof 242. The inner inductive coil stack 256 is coupled to RF power supply 260, and outer inductive coil stack 258 is coupled to RF power supply 262. The resistivity and thickness of the silicon roof 242 are chosen to permit axial RF magnetic fields produced by the inductive coil stacks 256, 258, to pass therethrough.

The inner inductive coil stack 256 and the outer inductive coil stack 258 inductively couple RF energy through the silicon roof 242 into a plasma process region 270 of the plasma etch process chamber 38, generating a plasma of reactive species therein. Alternatively, a single RF power supply (not shown) with an adjustable splitter (not shown) may be coupled to both the inner inductive coil stack 256 as well as the outer inductive coil stack 258.

The plasma etch process chamber 38 also includes an optical emission system 300. The optical emission system 300 is used to provide optical spectra of any reactive species within the plasma etch chamber 38 during a plasma etch process.

Referring to FIG. 1, the CVD process chamber 36 and the plasma etch process chamber 38 as described above are each controlled by a microprocessor controller 54. The microprocessor controller 54 may be one of any form of general purpose computer processor (CPU) that can be used in an industrial setting for controlling various chambers and subprocessors. The computer processor may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed after the substrate is positioned on the pedestal. The software routines, when executed, transform the general purpose computer into a specific process computer that controls the chamber operation so that a chamber process is performed. Alternatively, the software routines may be performed in hardware, as an application specific integrated circuit or other type of hardware implementation, or a combination of software and hardware.

Integrated Circuit Fabrication Processes

Figure 4A:
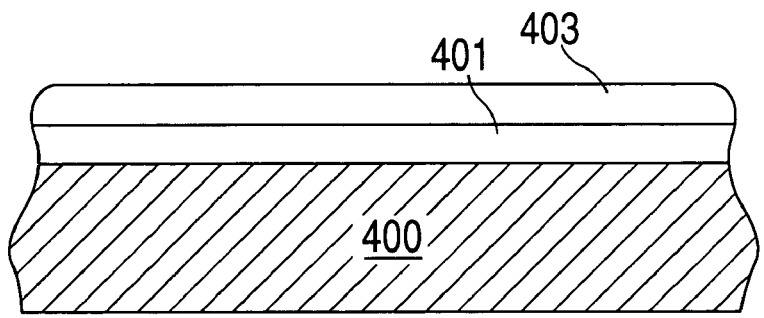
FIGS. 4a–4g illustrate schematic cross-sectional views of a substrate structure at different stages of a damascene structure fabrication sequence wherein an organosilicate layer formed on a silicon oxide layer is selectively etched.

Damascene Structure Incorporating a Silicon Oxide Layer Formed Between Two Organosilicate Layers FIGS. 4a–4g illustrate schematic cross-sectional views of a substrate 400 at different stages of a damascene structure fabrication sequence incorporating an silicon oxide layer formed between two organosilicate layers. Damascene structures are typically used to form metal interconnects on integrated circuits. Depending on the specific stage of processing, substrate 400 may correspond to a silicon substrate, or other material layer that has been formed on the substrate 400. FIG. 4a, for example, illustrates a cross-sectional view of a substrate 400 having conductive leads 401 and a barrier layer 403 formed thereon. The conductive leads 401 may be a metal (e.g., aluminum (Al) or copper (Cu)). The barrier layer 403 may be a low dielectric constant material (e.g., silicon carbide).

FIG. 4a illustrates one embodiment in which the substrate 400 is silicon having copper leads 401 formed thereon. The copper leads 401 have a thickness of about 5,000 Å to about 5 microns depending on the size of the structure to be fabricated. A barrier layer 403 is formed on the copper leads 401. The barrier layer 403 may be a silicon carbide layer. The barrier layer 403 has a thickness of about 200 Å to about 1,000 Å.

Figure 4B:
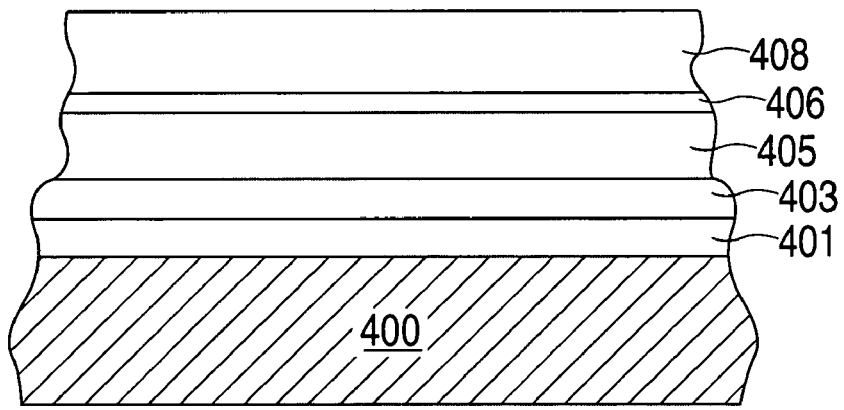

Referring to FIG. 4b, a first organosilicate layer 405 is formed on the barrier layer 403. The first organosilicate layer 405 may be formed by reacting a gas mixture including a silicon source, a carbon source and an oxygen source.

The silicon source and the carbon source may comprise an organosilane compound. Suitable organosilane compounds may have the general formula $Si_xC_yH_z$, where x has a range from 1 to 2, y has a range from 1 to 6, and z has a range from 4 to 18. For example, methylsilane ($SiCH_6$), dimethylsilane ($SiC_2H_8$), trimethylsilane ($SiC_3H_{10}$), tetramethylsilane ($SiC_4H_{12}$), bis(methylsilano)methane ($SiC_4H_{12}$), among others may be used as the organosilane compound.

Alternatively, the organosilane compound may have the general formula $Si_aC_bH_cO_d$, where a has a range from 1 to 2, b has a range from 1 to 10, c has a range from 6 to 30, and d has a range from 1 to 6. For example, methoxysilane ($SiCH_6O$), dimethyldimethoxysilane ($SiC_4H_{12}O_2$), diethyldiethoxysilane ($SiC_8H_{20}O_2$), dimethyldiethoxysilane ($SiC_6H_{16}O_2$), diethyidimethoxysilane ($SiC_6H_{16}O_2$), and hexamethyidisiloxane ($Si_2C_6H_{18}O$), among others are also suitable organosilane compounds.

Separate compounds for the silicon source and the carbon source may also be used. For example, silane ($SiH_4$), disilane ($Si_2H_6$), methane ($CH_4$), and combinations thereof, may be used for the separate silicon source and/or the carbon source.

Oxygen ($O_2$), ozone ($O_3$), nitrous oxide ($N_2O$), carbon monoxide (CO), carbon dioxide ($CO_2$), or combinations thereof, among others, may be used for the oxygen source.

The gas mixture may optionally include an inert gas. Helium (He), argon (Ar), neon (Ne), and xenon (Xe), as well as combinations thereof, among others, may be used for the inert gas.

In general the following deposition process parameters can be used to form the organosilicate layer in a process chamber similar to that shown in FIG. 2. The process parameters range from a wafer temperature of about 50° C. to about 500° C., a chamber pressure of about 1 torr to about 500 torr, a silicon source and/or carbon source flow rate of about 10 sccm to about 5,000 sccm, an oxygen source flow rate of about 10 sccm to about 500 sccm, an inert gas flow rate of about 10 sccm to about 10,000 sccm, a plate spacing of about 300 mils to about 600 mils, and an RF power of about 1 watt/cm$^2$ to about 500 watts/cm$^2$. The above process parameters provide a deposition rate for the organosilicate material in a range of about 0.1 microns/minute to about 2 microns/minute when implemented on a 200 mm (millimeter) substrate in a deposition chamber available from Applied Materials Inc., Santa Clara, Calif.

Other process chambers are within the scope of the invention, and the parameters listed above may vary according to the particular deposition chamber used to form the organosilicate material layer. For example, other deposition chambers may have a larger (e.g., configured to accommodate 300 mm substrates) or smaller volume, requiring gas flow rates that are larger or smaller than those recited for process chambers available from Applied Materials, Inc., Santa Clara, Calif.

The thickness of the first organosilicate layer 405 is variable depending on the specific stage of processing. Typically, the first organosilicate layer 405 has a thickness of about 3,000 Å to about 10,000 Å.

After the first organosilicate layer 405 is formed, a silicon oxide layer 406 is formed thereon. The silicon oxide layer 406 may be formed by reacting a gas mixture including a silicon source and an oxygen source.

The silicon source may comprise a silane compound. Suitable silane compounds may have the general formula $Si_xH_y$, where x has a range from 1 to 2, y has a range from 1 to 6. For example, silane ($SiH_4$) and disilane ($Si_2H_3$), among others may be used as the silane compound.

Oxygen ($O_2$), ozone ($O_3$), nitrous oxide ($N_2O$), carbon monoxide (CO), carbon dioxide ($CO_2$), or combinations thereof, among others, may be used for the oxygen source. The gas mixture may optionally include an inert gas. Helium (He), argon (Ar), neon (Ne), and xenon (Xe), as well as combinations thereof, among others, may be used for the inert gas.

In general the following deposition process parameters can be used to form the silicon oxide layer in a process chamber similar to that shown in FIG. 2. The process parameters range from a wafer temperature of about 50° C. to about 500° C., a chamber pressure of about 1 torr to about 500 torr, a silicon source flow rate of about 10 sccm to about 5,000 sccm, an oxygen source flow rate of about 10 sccm to about 500 sccm, an inert gas flow rate of about 10 sccm to about 10,000 sccm, a plate spacing of about 300 mils to about 600 mils, and an RF power of about 1 watt/cm$^2$ to about 500 watts/cm$^2$. The above process parameters provide a deposition rate for the silicon oxide material in a range of about 0.1 microns/minute to about 1 microns/minute when implemented on a 200 mm (millimeter) substrate in a deposition chamber available from Applied Materials Inc., Santa Clara, Calif.

Other process chambers are within the scope of the invention, and the parameters listed above may vary according to the particular deposition chamber used to form the silicon oxide material layer. For example, other deposition chambers may have a larger (e.g., configured to accommodate 300 mm substrates) or smaller volume, requiring gas flow rates that are larger or smaller than those recited for process chambers available from Applied Materials, Inc., Santa Clara, Calif.

The thickness of the silicon oxide layer 406 is variable depending on the specific stage of processing. Typically, the silicon oxide layer 406 has a thickness of about 100 Å to about 1,000 Å.

After the silicon oxide layer 406 is formed, a second organosilicate layer 408 is formed thereover. The second organosilicate layer 408 may be formed according to the process parameters described above for the first organosilicate layer 405. The thickness of the second organosilicate layer 408 is variable depending on the specific stage of processing. Typically, the second organosilicate layer 408 has a thickness of about 5,000 Å to about 10,000 Å.

Figure 4C:
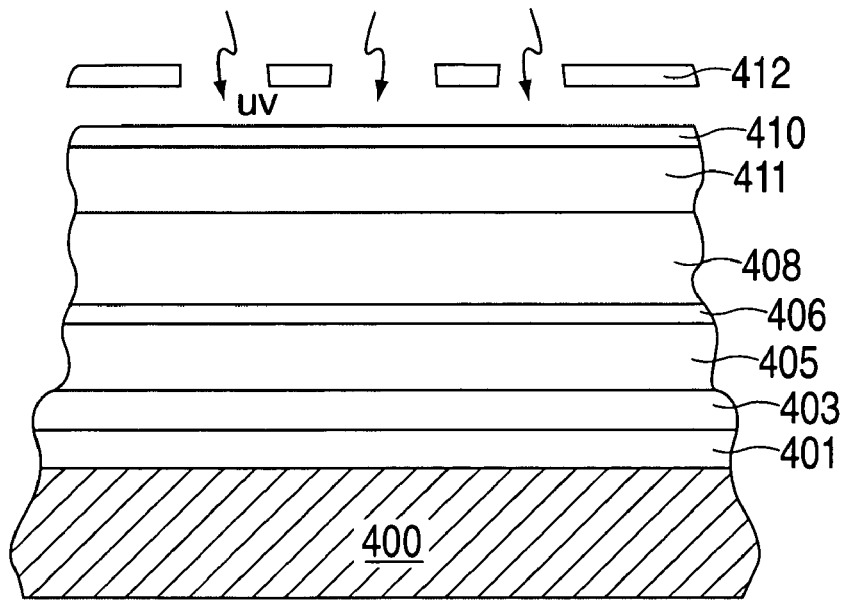

Referring to FIG. 4c, a layer of energy sensitive resist material 410 is formed on the second organosilicate layer 408. The layer of energy sensitive resist material 410 may be spin coated on the substrate to a thickness within a range of about 4,000 Å to about 10,000 Å. Most energy sensitive resist materials are sensitive to ultraviolet (UV) radiation having a wavelength less than about 450 nm (nanometers). Deep ultraviolet (DUV) resist materials are sensitive to UV radiation having wavelengths less than about 250 nm.

Dependant on the etch chemistry of the energy sensitive resist material used in the fabrication sequence, an intermediate layer 411 may be formed on the second organosilicate layer 408. When the energy sensitive resist material 410 and the second organosilicate layer 408 can be etched using the same chemical etchants, the intermediate layer 411 functions as a mask for the second organosilicate layer 408. The intermediate layer 411 is conventionally formed on the second organosilicate layer 408. The intermediate layer 411 may be an oxide, amorphous silicon, or other suitable material layer.

Figure 4D:
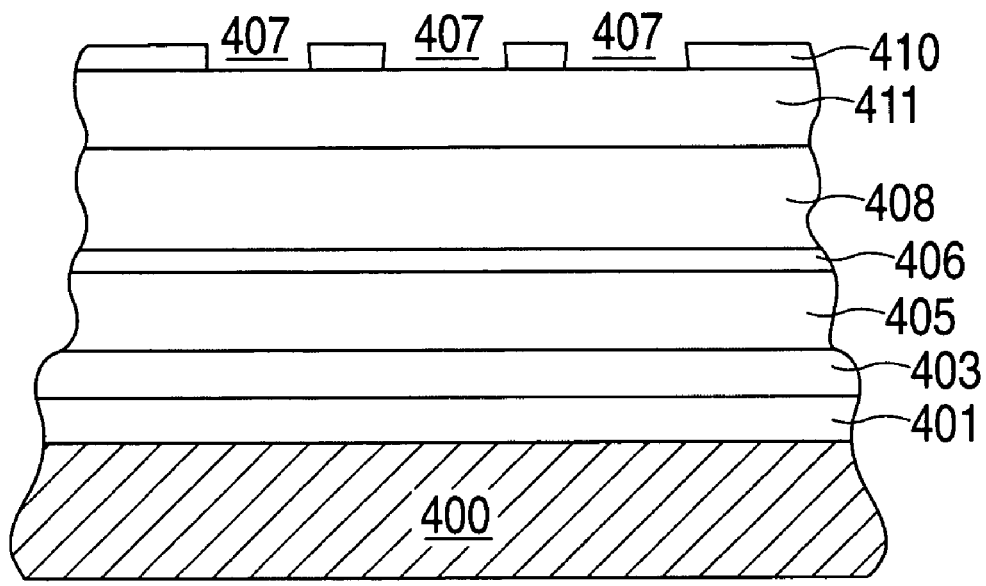

An image of a via pattern 407 is introduced into the layer of energy sensitive resist material 410 by exposing such energy sensitive resist material 410 to UV radiation via mask 412. The image of the via pattern 407 introduced into the layer of energy sensitive resist material 410 is developed in an appropriate developer to define the via pattern 407 therethrough, as shown in FIG. 4d.

Figure 4E:
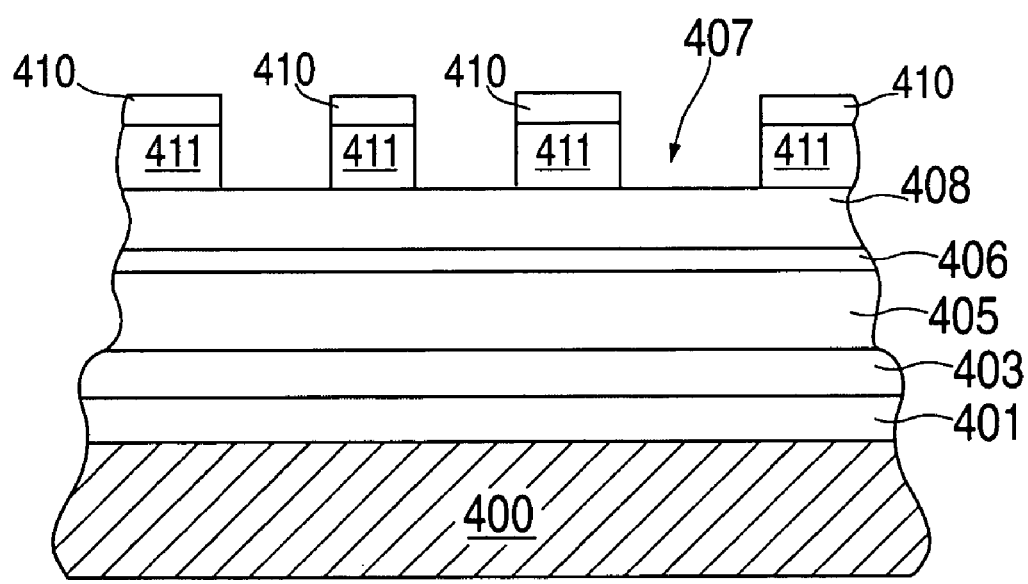

Thereafter, referring to FIG. 4e, the via pattern 407 defined in the energy sensitive resist material 410 is transferred through the second organosilicate layer 408 to the silicon oxide layer 406 using the energy sensitive resist material 410 as a mask. The via pattern 407 is transferred through the second organosilicate layer 408 by etching it using a hydrogen-containing fluorocarbon plasma.

The hydrogen-containing fluorocarbon plasma may be generated from a gas mixture comprising one or more hydrogen-containing fluorocarbon gases such as trifluoromethane ($CHF_3$), difluoromethane ($CH_2F_2$), fluoromethane ($CH_3F$), among others. In addition, the gas mixture may also include fluorocarbon gases such as carbon tetrafluoride ($CF_4$) and fluoroethane ($C_2F_6$), among others.

The gas mixture may optionally include hydrogen ($H_2$). The gas mixture may also include gases such as nitrogen ($N_2$), oxygen ($O_2$), helium (He), argon (Ar), and combinations thereof, among others.

In general the following process parameters can be used to generate the hydrogen-containing fluorocarbon plasma in a process chamber similar to that shown in FIG. 3. The process parameters range from a chamber temperature of about −20° C. to about 80° C., a chamber pressure of about 5 mtorr to about 1 torr, a hydrogen-containing fluorocarbon gas flow rate of about 5 sccm to about 200 sccm, a hydrogen gas flow rate of about 5 sccm to about 200 sccm, an inert gas flow rate of about 5 sccm to about 500 sccm, and a radio frequency (RF) power of about 1 watt/cm$^2$ to about 100 watts/cm$^2$. The above process parameters provide an etch rate for the second organosilicate layer 408 in a range of about 500 Å/minute to about 10,000 Å/minute when implemented on a process chamber configured to accommodate 200 mm substrates available from Applied Materials, Inc., Santa Clara, Calif.

Other process chambers are within the scope of the invention, and the parameters listed above may vary according to the particular process chamber used to etch the organosilicate material layer. For example, other process chambers may have a larger (e.g., configured to accommodate 300 mm substrates) or smaller volume, requiring gas flow rates that are larger or smaller than those recited for process chambers available from Applied Materials, Inc., Santa Clara, Calif.

The hydrogen-containing fluorocarbon plasma advantageously uniformly etches the organosilicate layer from center to edge with fewer defects than for non-hydrogen-containing fluorocarbon plasmas. For example, a $C_4F_8$/$C_2F_6$— based plasma maintained at an etch rate of about 6350 Å/min formed about 2100 defects/unit area in an organosilicate layer, while a $CHF_3$/$C_2F_6$— based plasma maintained at an etch rate of about 6400 Å/min formed about 75 defects/unit area in an organosilicate layer.

Additionally, the hydrogen-containing fluorocarbon plasma advantageously has an etch selectivity of organosilicate:silicon oxide of greater than 2.5:1. Such an etch selectivity, permits the use of silicon oxide having a dielectric constant less than about 3.0 as a stop etch layer in a damascene structure. Incorporating the low dielectric constant silicon oxide into the damascene structure reduces the overall dielectric constant for the device, as well as capacitive coupling between adjacent devices.

After the via pattern 407 is transferred through the second organosilicate layer 408, such pattern is transferred through the silicon oxide layer 406. The via pattern may be transferred through the silicon oxide layer 406 using a fluorocarbon plasma.

The fluorocarbon plasma may be generated from a gas mixture comprising one or more fluorocarbon gases such as carbon tetrafluoride ($CF_4$) and fluoroethane ($C_2F_6$), among others. The gas mixture may also include gases such as nitrogen ($N_2$), oxygen ($O_2$), helium (He), argon (Ar), and combinations thereof, among others.

In general the following process parameters can be used to generate the fluorocarbon plasma in a process chamber similar to that shown in FIG. 3. The process parameters range from a chamber temperature of about −20° C. to about 80° C., a chamber pressure of about 5 mtorr to about 1 torr, a fluorocarbon gas flow rate of about 5 sccm to about 200 sccm, an oxygen ($O_2$) flow rate of about 5 sccm to about 200 sccm, an inert gas flow rate of about 5 sccm to about 500 sccm, and a radio frequency (RF) power of about 1 watt/cm$^2$ to about 100 watts/cm$^2$. The above process parameters provide an etch rate for the silicon oxide layer 406 in a range of about 500 Å/minute to about 5,000 Å/minute when implemented on a process chamber configured to accommodate 200 mm substrates available from Applied Materials, Inc., Santa Clara, Calif.

Figure 4F:
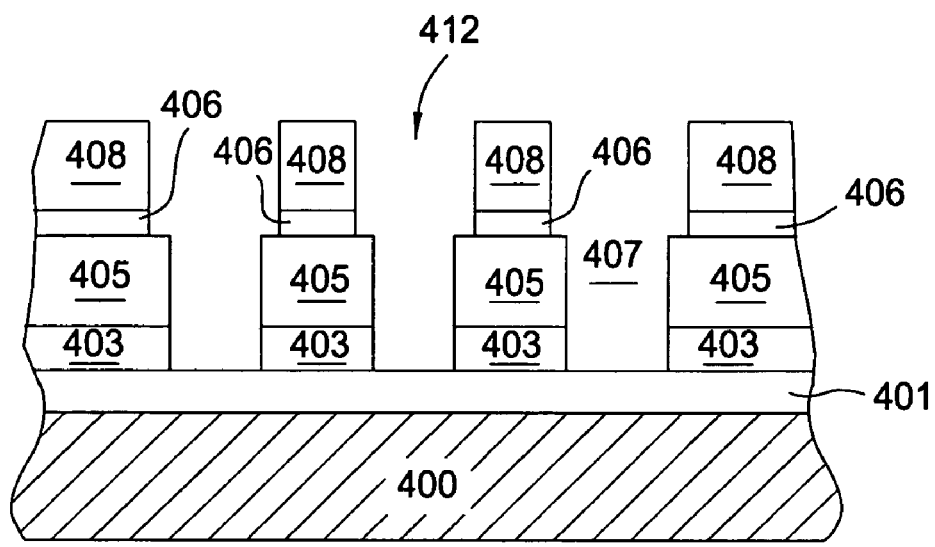

After the via pattern 407 is transferred through the silicon oxide layer 406, interconnect lines 412 are formed in the second organosilicate layer 408, as illustrated in FIG. 4f. The interconnect lines are formed in the second organosilicate layer 408 preferably using conventional lithography process described above. The interconnect lines 412 formed in the second organosilicate layer 408 are positioned over the vias 407 formed therein. Thus, when the interconnect lines 412 are defined in the second organosilicate layer 408, the via pattern 407 is transferred through the first organosilicate layer 405. The interconnect lines 412 and the vias 407 are transferred through the second organosilicate layer 408 and the first organosilicate layer 405, respectively, by etching them using the hydrogen-containing fluorocarbon plasma as described above.

Figure 4G:
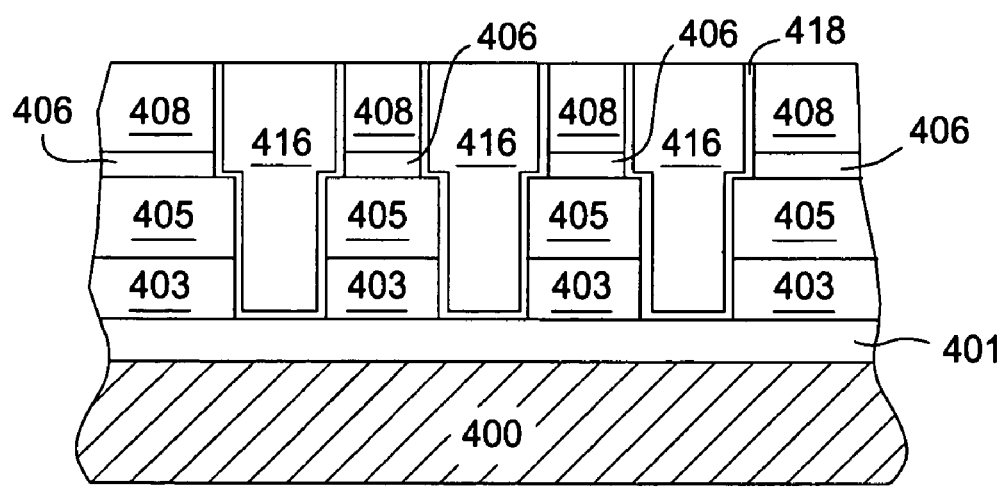

Thereafter, referring to FIG. 4g, the interconnect lines 412 and the vias 407 are filled with a conductive material 416 such as aluminum (Al), copper (Cu), tungsten (W), or combinations thereof. Preferably, copper (Cu) is used to fill the interconnect lines 412 and the vias 407 due to its low resistivity (resistivity of about 1.7 μΩ/cm). The conductive material 416 may be deposited using chemical vapor deposition (CVD) techniques, physical vapor deposition (PVD) techniques, electroplating techniques, or combinations thereof, to form the damascene structure.

Additionally, a barrier layer 418 such as tantalum (Ta), tantalum nitride (TaN), or other suitable barrier material may be deposited conformably on the sidewalls of the interconnect lines 412 and the vias 407, before filling them with the conductive material 416. The barrier layer 418 functions to prevent metal migration into the surrounding first and second bulk insulating layers 405, 408.

Although several preferred embodiments which incorporate the teachings of the present invention have been shown and described in detail, those skilled in the art can readily devise many other varied embodiments that still incorporate these teachings.

What is claimed is:

1. A method of fabricating a damascene structure, comprising:
   (a) forming a barrier layer on a substrate having a metal layer thereon;
   (b) forming a first organosilicate layer on the barrier layer;
   (c) forming a silicon oxide layer on the first organosilicate layer;
   (d) forming a second organosilicate layer on the silicon oxide layer; and
   (e) etching the second organosilicate layer to define vias therein, wherein the second organosilicate layer is etched with a gas mixture comprising a hydrogen-containing fluorocarbon and one or more gases selected from the group consisting of hydrogen ($H_2$), nitrogen ($N_2$), oxygen ($O_2$), argon (Ar), and helium (He).

2. The method of claim 1, further comprising:
   (f) etching the silicon oxide layer to transfer the vias defined in the second organosilicate layer therethrough;
   (g) patterning the second organosilicate layer to define interconnects therethrough, wherein the interconnects are positioned over the vias, and wherein the via pattern is transferred through the first organosilicate layer when the interconnects are defined in the second organosilicate layer; and
   (g) filling the vias and interconnects with a conductive material.

3. The method of claim 2 wherein the interconnects are defined in the second organosilicate layer and the vias are defined in the first organosilicate layer using a hydrogen-containing fluorocarbon gas mixture.

4. The method of claim 2 wherein the conductive material filling the vias and interconnects is selected from the group of copper (Cu), aluminum (Al), tungsten (W), and combinations thereof.

5. The method of claim 1 wherein the gas mixture includes one or more gases selected from the group consisting of trifluoromethane ($CHF_3$), difluoromethane ($CH_2F_2$), and fluoromethane ($CH_3F$).

6. The method of claim 1 wherein the gas mixture further comprises a gas selected from the group consisting of carbon tetrafluoride ($CF_4$), fluoroethane ($C_2F_6$), and combinations thereof.

7. The method of claim 1 wherein the gas mixture includes hydrogen ($H_2$).

8. The method of claim 1 wherein the second organosilicate layer is etched at a temperature within a range of about −20° C. to about 80°.

9. The method of claim 1 wherein the second organosilicate layer is etched at a pressure within a range of about 5 mtorr to about 1 torr.

10. The method of claim 1, further comprising applying an electric field to the hydrogen-containing fluorocarbon gas mixture.

11. The method of claim 10 wherein the electric field is a radio frequency (RF) power.

12. The method of claim 11 wherein the RE power is within a range of about 1 watt/cm$^2$ to about 100 watts/cm$^2$.

13. The method of claim 2 wherein the silicon oxide layer is etched with a fluorocarbon gas mixture.

14. The method of claim 13 wherein the fluorocarbon gas mixture comprises a gas selected from the group consisting of carbon tetrafluoride ($CF_4$), fluoroethane ($C_2F_6$), and combinations thereof.

15. The method of claim 14 wherein the fluorocarbon gas mixture further includes one or more gases selected from the group consisting of hydrogen ($H_2$), nitrogen ($N_2$), oxygen ($O_2$), argon (Ar), and helium (He).

16. The method of claim 13 wherein the silicon oxide layer is etched at a temperature within a range of about −20° C. to about 80°.

17. The method of claim 13 wherein the silicon oxide layer is etched at a pressure within a range of about 5 mtorr to about 1 torr.

18. The method of claim 13 further comprising applying an electric field to the fluorocarbon gas mixture.

19. The method of claim 18 wherein the electric field is generated using radio frequency (RF) power.

20. The method of claim 19 wherein the RE power is within a range of about 1 watt/cm$^2$ to about 100 watts/cm$^2$.

21. A method for fabricating a damascene structure, comprising:

(a) forming a barrier layer on a substrate having a metal layer thereon;

(b) forming a first organosilicate layer on the barrier layer;

(c) forming a silicon oxide layer on the first organosilicate layer;

(d) forming a second organosilicate layer on the silicon oxide layer; and (e) etching the second organosilicate layer to define vias therein, wherein the second organosilicate layer is etched with a gas mixture comprising one or more hydrogen-containing fluorocarbon gases and one or more gases selected from the group consisting of hydrogen ($H_2$), nitrogen ($N_2$), oxygen ($O_2$), argon (Ar), and helium (He); and (f) etching the silicon oxide layer to transfer the vias defined in the second organosilicate layer therethrough, wherein the silicon oxide layer is etched with a gas mixture comprising a fluorocarbon gas.

22. The method of claim 21, wherein the gas mixture for etching the second organosilicate layer comprises hydrogen ($H_2$).

23. The method of claim 21 wherein the gas mixture for etching the second organosilicate layer comprises trifluoromethane, dimethylfluoride, and hydrogen.

24. The method of claim 21 wherein the gas mixture for etching the second organosilicate layer comprises difluoromethane, tetrafluoride, and hydrogen.

* * * * *

UNITED STATES PATENT AND TRADEMARK OFFICE
CERTIFICATE OF CORRECTION

| | |
|---|---|
| PATENT NO. | : 7,183,201 B2 |
| APPLICATION NO. | : 09/912103 |
| DATED | : February 27, 2007 |
| INVENTOR(S) | : Nguyen et al. |

It is certified that error appears in the above-identified patent and that said Letters Patent is hereby corrected as shown below:

Column 11, Claim 12, Line 28: Change "RE" to --RF--

Column 12, Claim 20, Line 8: Change "RE" to --RF--

Column 12, Claim 24, Line 39: Change "organosil icate" to --organosilicate--

Signed and Sealed this

Nineteenth Day of June, 2007

JON W. DUDAS
*Director of the United States Patent and Trademark Office*